United States Patent
Min et al.

(10) Patent No.: US 12,328,971 B2
(45) Date of Patent: Jun. 10, 2025

(54) MICRO LED CHIP TRANSFER METHOD

(71) Applicant: HARDRAM CO., LTD., Ansan-si (KR)

(72) Inventors: Sung Wook Min, Incheon (KR); Jae Hong Lim, Ansan-si (KR)

(73) Assignee: HARDRAM CO., LTD., Ansan-si (KR)

( * ) Notice: Subject to any disclaimer, the term of this patent is extended or adjusted under 35 U.S.C. 154(b) by 479 days.

(21) Appl. No.: 17/918,229

(22) PCT Filed: Feb. 24, 2021

(86) PCT No.: PCT/KR2021/002280
§ 371 (c)(1),
(2) Date: Oct. 11, 2022

(87) PCT Pub. No.: WO2021/215641
PCT Pub. Date: Oct. 28, 2021

(65) Prior Publication Data
US 2023/0197884 A1 Jun. 22, 2023

(30) Foreign Application Priority Data
Apr. 21, 2020 (KR) .......... 10-2020-0048211

(51) Int. Cl.
*H10H 20/01* (2025.01)
*H01L 25/075* (2006.01)

(52) U.S. Cl.
CPC ........ *H10H 20/01* (2025.01); *H01L 25/0753* (2013.01)

(58) Field of Classification Search
CPC ................ H10H 20/01; H01L 25/0753; H01L 21/67144; H01L 21/52; H01L 21/67259
See application file for complete search history.

(56) References Cited

U.S. PATENT DOCUMENTS
2021/0288209 A1*  9/2021 Kwag ............... H01L 24/75

FOREIGN PATENT DOCUMENTS
| JP | 2002-198569 A | 7/2002 |
| JP | 2006-337910 A | 12/2006 |
| KR | 10-1956231 B1 | 3/2019 |
| KR | 10-1972481 B1 | 4/2019 |
| KR | 10-2020-0011024 A | 1/2020 |

OTHER PUBLICATIONS

International Search Report for PCT/KR2021/002280 mailed Jun. 3, 2021 from Korean Intellectual Property Office.

* cited by examiner

*Primary Examiner* — Ratisha Mehta
(74) *Attorney, Agent, or Firm* — Paratus Law Group, PLLC

(57) ABSTRACT

A micro LED chip transfer method includes: determining the transfer object size for a transfer, by using a block-by-block LED chip map in which the use state information of an LED chip is stored for each block of the wafer; determining a mask size that can minimize a scrap block of the wafer that is not used for transfer, by using the transfer object size; determining a starting point position of the wafer transfer object region for transfer; and positioning a mask having the mask size at the starting point position of the wafer transfer object region and irradiating a laser, such that the LED chip formed in the wafer transfer object region is transferred.

5 Claims, 13 Drawing Sheets

FIG. 4
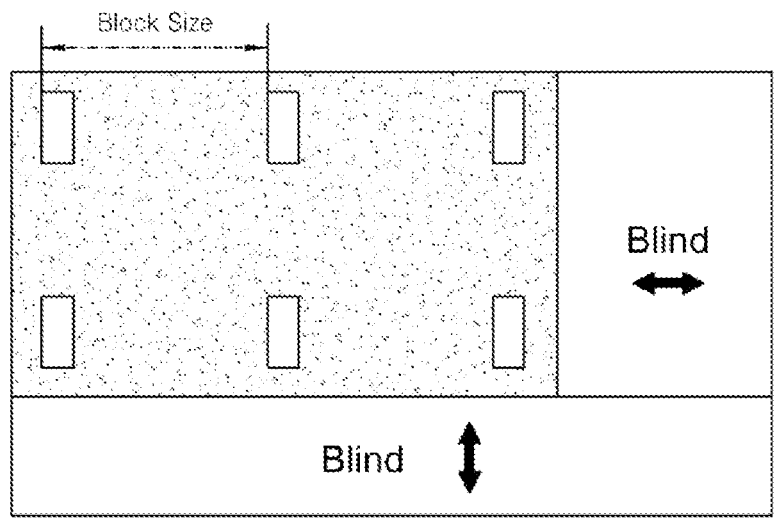
(a) 3 × 2 mask
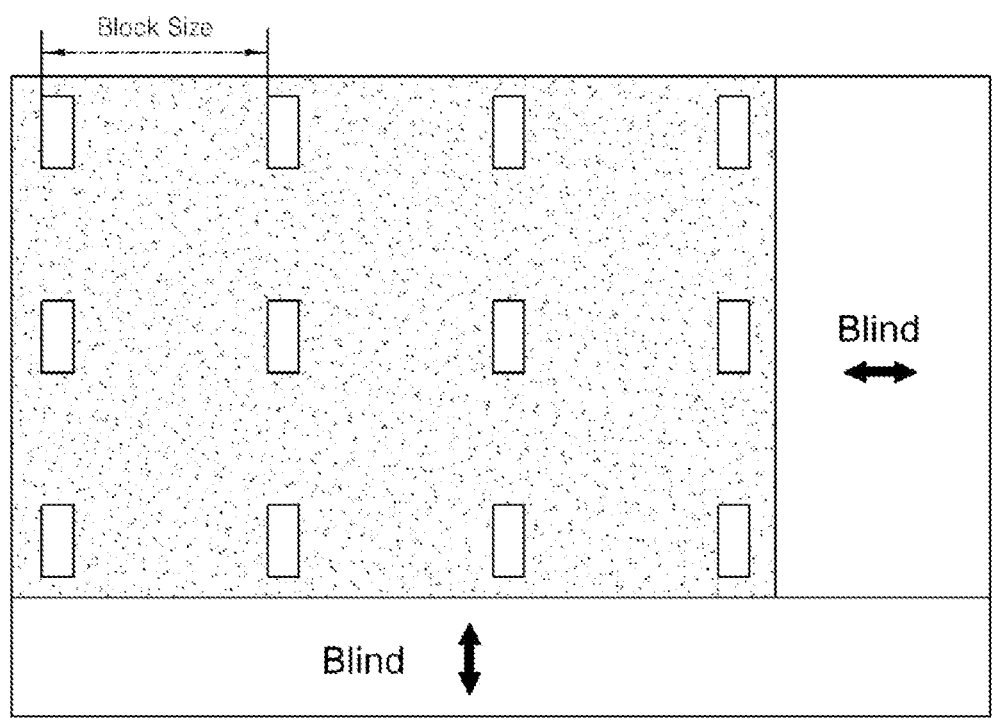
(a) 4 × 3 mask

FIG. 13
(a) 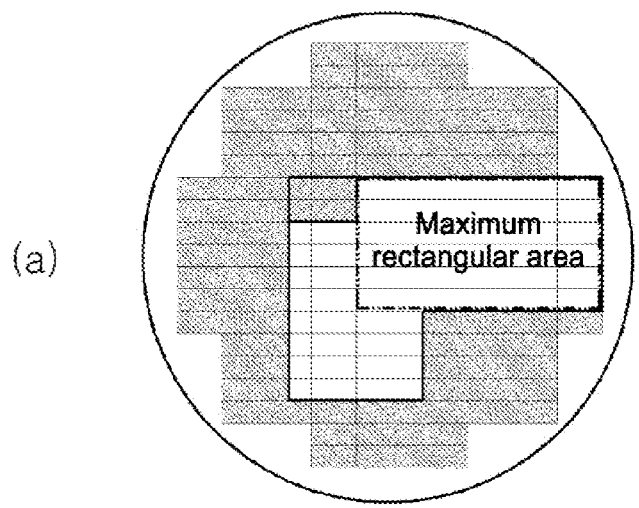
(b) 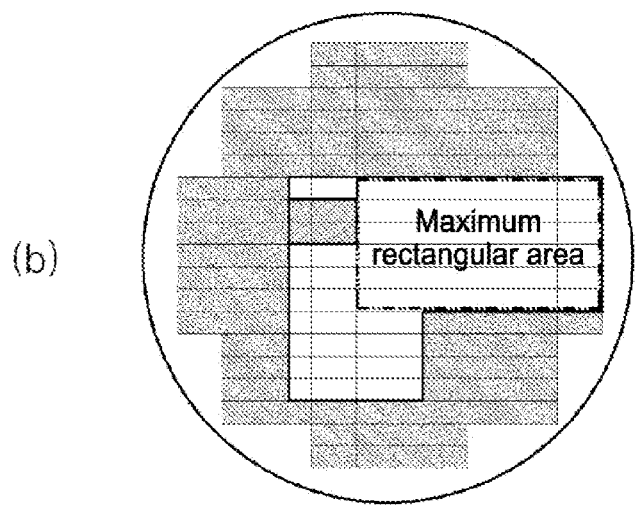
(c) 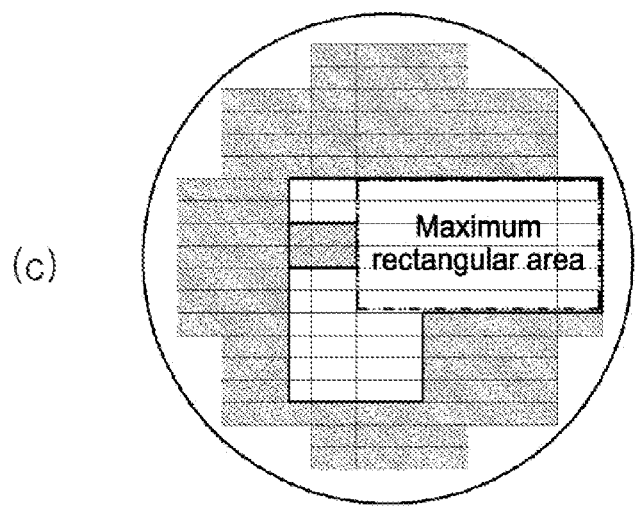

MICRO LED CHIP TRANSFER METHOD

CROSS-REFERENCE TO PRIOR APPLICATIONS

This application is a National Stage Patent Application of PCT International Patent Application No. PCT/KR2021/002280 (filed on Feb. 24, 2021) under 35 U.S.C. § 371, which claims priority to Korean Patent Application No. 10-2020-0048211 (filed on Apr. 21, 2020), which are all hereby incorporated by reference in their entirety.

BACKGROUND

The present invention relates to a micro-LED chip transfer method, and more particularly, to a micro-LED chip transfer method for transferring a micro-LED chip on a glass substrate.

The LED studied much recently as a global issue is spotlighted as a technique of developing micro-level LED chips with a light emitting area of 100×100 μm or less, rather than existing optical devices for large-area lamps of $cm^2$ level. However, as extremely small-sized micro-LED chips are developed, a transfer technique capable of directly transferring a device onto a substrate as is in an application stage is regarded as important in order to directly use the developed micro-LED chips.

A vertical LED has a structure of vertically arranging n (−) and p (+) electrodes, and is manufactured by growing an LED structure of n-type semiconductor/active region/n-type semiconductor on a glass substrate, and removing the LED structure from the glass substrate using a Laser Lift-Off (LLO) technique.

FIG. 1 is a view showing the concept of a transfer process based on laser lift-off (LLO), which shows a view of growing an LED structure on a glass substrate by radiating a laser beam on the top of a wafer. As shown in FIG. 1, the laser lift-off (LLO) technique is a method of using decomposition of a release layer, in which a release layer (sacrifice layer) on the bottom surface of a wafer is inserted between LED chips so that when a laser beam of a line shape is radiated, absorption of the laser beam occurs in the release layer, and thus the release layer is decomposed. That is, as a laser beam of a specific wavelength is absorbed in the release layer, and the release layer is heated accordingly, thermal decomposition occurs. At this point, laser lift-off may occur only when volatile atoms are included in the release layer material so that the release layer may be decomposed. That is, lift-off occurs and lifts a device when volatile atoms, e.g., N2, O2, and H2, are generated between the release layer and the device by thermal decomposition.

The technique based on the micro-LED chip is in the stage of research and development, and researches for utilizing the micro-LED chip as a cell of a light source are under progress. A technique most urgently required to realize the researches is a technique of transferring a micro-LED chip onto a transparent glass substrate that is used as a display material.

FIG. 2 is an exemplary view showing a red wafer on which micro-Red-LED chips are provided. The wafer has a plurality of blocks, and each block has M×N red-LED chips.

However, since the blocks are not formed on the entire area of the wafer, there is a problem in that the efficiency of using the micro-LED chips on the wafer is lowered when transfer based on laser lift-off (LLO) is performed by radiating a laser beam on the wafer. That is, the transfer is carried out by an integer multiple of blocks, and therefore, since there are occasions in which blocks on the edges of a wafer may not be used for transfer, there is a problem in that the efficiency of using the micro-LED chips is lowered.

SUMMARY

The technical problem of the present invention is that when transfer based on laser lift-off (LLO) is performed by radiating a laser beam on a wafer on which micro-LED chips are formed, the efficiency of using the micro-LED chips on the wafer is lowered.

To accomplish the above object, according to one aspect of the present invention, there is provided a micro-LED chip transfer method based on laser lift-off (LLO) for transferring micro-LED chips formed in each block of a wafer onto a glass substrate, the method comprising: a transfer target size determination step of determining a size of a transfer target to be transferred using a block-specific LED chip map that stores information on a state of using the LED chips for each block of the wafer; a mask size determination step of determining, using the transfer target size, a mask size that can minimize scrap blocks of the wafer not used for transfer when transfer of the LED chips is performed on the wafer targeting non-transferred blocks of the wafer, which are blocks of unused LED chips; a wafer transfer target area position determination step of determining a starting point position of a wafer transfer target area to be transferred; and a transfer step of transferring LED chips formed in the wafer transfer target area by positioning a mask having the mask size at the starting point position of the wafer transfer target area and radiating a laser beam thereon.

The transfer target size determination step may include: a block-specific LED chip map search step of extracting a block-specific LED chip map having the largest number of unused LED chips by searching a block-specific LED chip map that stores information on the state of using the LED chips for each block of the wafer; a wafer non-transferred maximum size determination step of determining a largest rectangular area, in which LED chips are not used, from the extracted block-specific LED chip map as a wafer non-transferred maximum size; a glass non-transferred maximum size determination step of determining a largest rectangular area in a non-transferred area on the glass substrate as a glass non-transferred maximum size; and a comparison and determination step of comparing the wafer non-transferred maximum size and the glass non-transferred maximum size, and determining a smaller size as the transfer target size.

The information on the state of using the LED chips may be information that can distinguish transfer-use (U), transfer-not-use (NU), and LED chip Not-Exist (NE).

The mask size determination step may include: an integer multiple determination step of determining whether the transfer target size is an integer multiple of the maximum mask size; an integer multiple-based mask size determination step of determining the maximum mask size as the mask size when the transfer target size is an integer multiple of the maximum mask size; and a non-integer multiple-based mask size determination step of calculating, when the transfer target size is not an integer multiple of the maximum mask size, the number of maximum size transfers, which is the number of transfers when the wafer transfer target area is transferred with the maximum mask size, and the number of reduced size transfers, which is the number of transfers when transfer is performed with a reduced mask size that can transfer the entire wafer transfer target area, and then determining a mask size in consideration of the calculated number of maximum size transfers and reduced size transfers.

The non-integer multiple-based mask size determination step may determine the reduced mask size as the mask size when the number of times obtained by subtracting the number of maximum size transfers from the number of reduced size transfers is within a preset option value, and determine the maximum mask size as the mask size when the number of times obtained by subtracting the number of maximum size transfers from the number of reduced size transfers is out of the option value.

The wafer transfer target area position determination step may determine the starting point position of the wafer transfer target area using the mask size.

The wafer transfer target area position determination step may include: a maximum rectangular area size detection step of detecting, when the starting point position of a mask having the mask size is positioned at a block of unused LED chips, a size of a maximum rectangular area, which is obtained by adding remaining other blocks of unused LED chips, for each block of unused LED chips; and a starting point position determination step of comparing the detected size of a maximum rectangular area for each block of unused LED chips, and determining a block of unused LED chips having the maximum rectangular area of the largest size as the starting point position of the mask.

The maximum rectangular area size detection step may detect a size of a maximum rectangular area only for edge blocks in the non-transferred area of the wafer.

When a plurality of blocks of unused LED chips having a maximum rectangular area of the largest size is detected at the starting point position determination step, a block of unused LED chips having the largest number of adjacent blocks of used LED chips, among the blocks of unused LED chips detected as having the maximum rectangular area of the largest size, may be determined as the starting point position of the mask.

According to the embodiment of the present invention, when transfer using a wafer is performed, the transfer is performed through a rectangular mask, and thus scrap blocks of the wafer are not transferred, and therefore, there is an inefficiency in that LED chips in the scrap blocks are not used. As the transfer is performed using a mask of a size that may enhance the efficiency of using the scrap blocks, the efficiency of using the LED chips may be enhanced by minimizing the scrap blocks.

BRIEF DESCRIPTION OF THE DRAWINGS

FIG. 4 is an exemplary view showing blind masks of variable mask size according to an embodiment of the present invention.

FIG. 13 is a view showing an example of blocks of unused LED chips having the maximum rectangular area of the largest size according to an embodiment of the present invention.

DETAILED DESCRIPTION

Hereinafter, the advantages and features of the present invention and a method for achieving them will become apparent with reference to the embodiments described below in detail together with the accompanying drawings. However, the present invention is not limited to the embodiments disclosed below, but will be implemented in a variety of different forms, and is provided to fully inform the scope of the present invention to those skilled in the art. In addition, when it is determined in the description of the present invention that related known techniques may obscure the gist of the present invention, detailed description thereof will be omitted.

Figure 3:
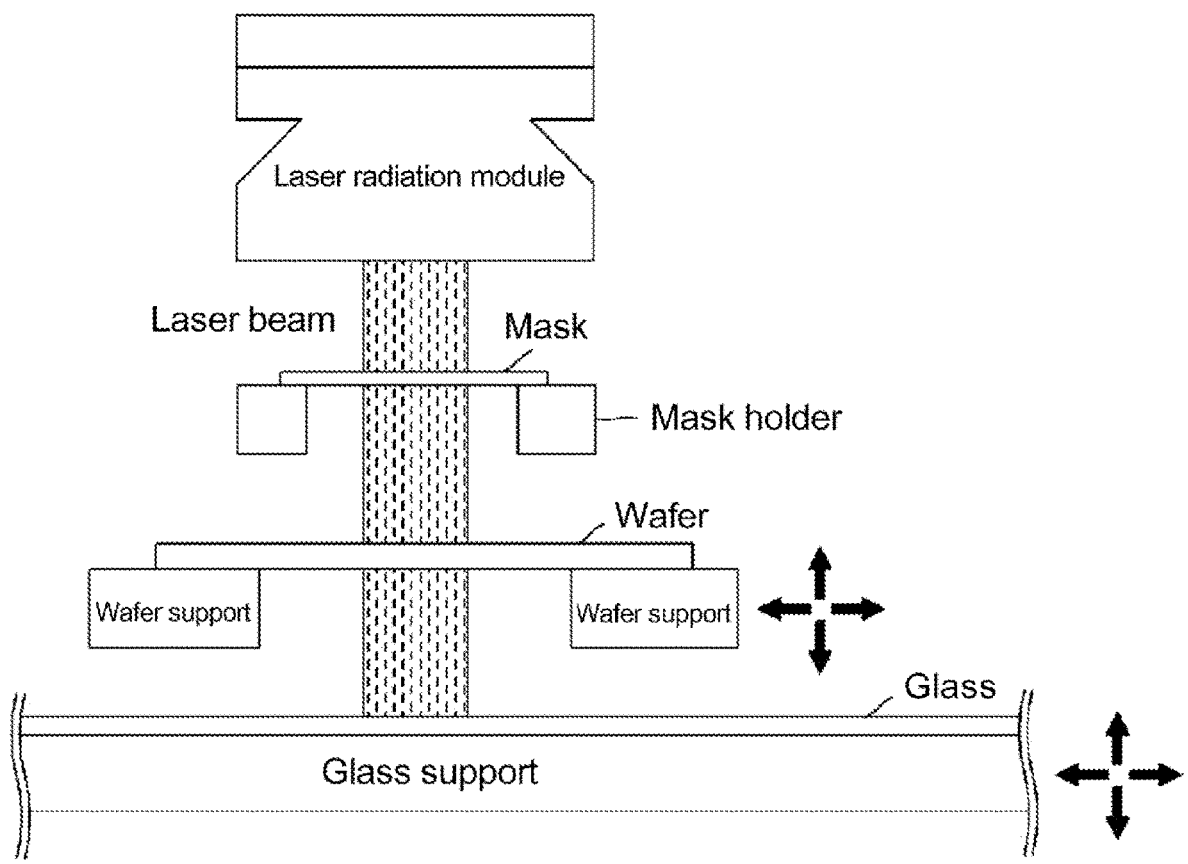
FIG. 3 is a view showing the configuration of a micro-LED chip transfer device according to an embodiment of the present invention.

FIG. 3 is a view showing the configuration of a micro-LED chip transfer device according to an embodiment of the present invention, and FIG. 4 is an exemplary view showing blind masks of variable mask size according to an embodiment of the present invention.

Hereinafter, an LED chip refers to an LED chip of a micro unit, and a micro-LED chip will be referred to as an LED chip in short.

The micro-LED chip transfer device of the present invention for manufacturing a micro-LED chip by applying laser lift-off (LLO) may include, as shown in FIG. 3, a glass support, a wafer support, a mask holder, a laser radiation module, and a controller.

The glass support is a support (substrate) on which the glass substrate is placed and may move up and down, and left and right. Here, the glass substrate is a substrate on the top surface of which LED chips are formed as the LED chips of a wafer are melted and dropped to be transferred on the top surface by the laser beam passing through the mask and the wafer in order.

The wafer support is a support (substrate) on which a wafer is placed and may move up and down, and left and right. LED chips are arranged on the wafer in units of blocks, and one block is configured of as many LED chips as a horizontal number x a vertical number.

In addition, the wafer may include an R-wafer, a G-wafer, and a B-wafer. In the case of the R-wafer, a plurality of micro-Red-LED chips are formed, in the case of the G-wafer, a plurality of micro-Green-LED chips are formed, and in the case of the B-wafer, a plurality of micro-Blue-LED chips are formed.

The mask selectively transmits the laser beam onto the top surface, and thickness of the mask is not limited.

The mask is implemented as a blind mask, and the size of the mask may vary by adjusting the blind as shown in FIG. 4. That is, the mask may be adjusted as a 3×2 mask as shown in FIG. 4(a), or a 4×3 mask as shown in FIG. 4(b).

The laser radiation module is a light radiator that outputs a laser beam in the form of a line beam toward the top surface of the mask. Here, the laser radiation module is a known configuration that generates a laser beam L, and various types of lasers such as excimer laser, DPSS laser, and the like may be used according to bandgap energy. In this embodiment, the laser radiation module may be an excimer laser having a wavelength of 157 to 350 nm. In addition, the wavelength of the laser beam output from the laser radiation module is preferably in the ultraviolet wavelength region. In addition, the laser radiation module is further provided with a line beam forming means for generating a line beam of a line shape.

In transferring the LED chips, the controller determines a size of a transfer target to be transferred using a block-specific LED chip map that stores information on the state of using the LED chips for each block of the wafer. In addition, when transfer of LED chips is performed on the wafer targeting non-transferred blocks of the wafer, which are blocks of unused LED chips, the controller determines a mask size that can minimize scrap blocks of the wafer, which are blocks not used for transfer, using the transfer target size. Thereafter, after determining a starting point position of a wafer transfer target area to be transferred, the controller controls to transfer the LED chips formed in the wafer transfer target area by positioning a mask having the mask size at the starting point position of the wafer transfer target area and radiating a laser beam. Hereinafter, it will be described in detail with reference to FIGS. 5 to 13.

Figure 5:
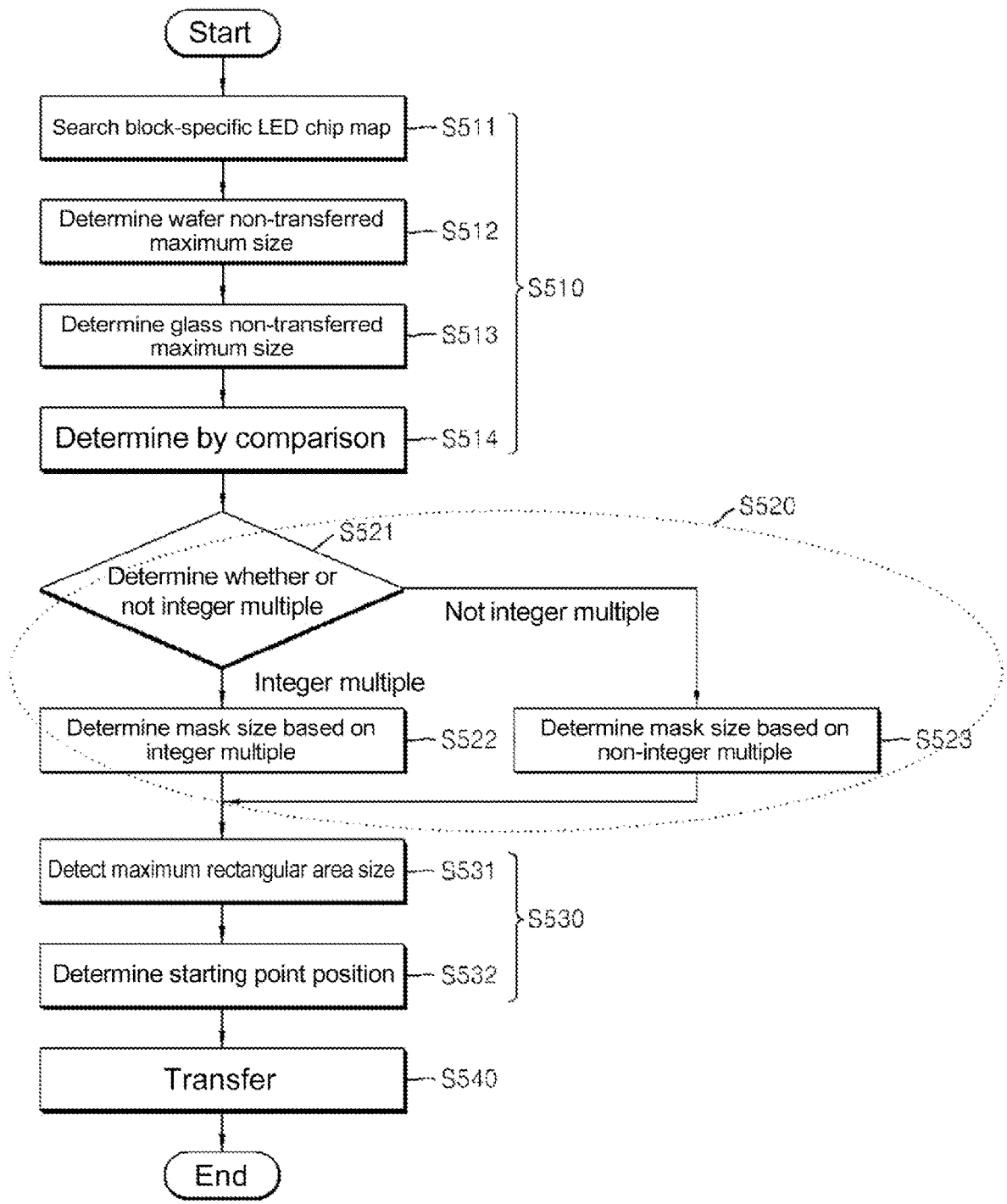
FIG. 5 is a flowchart illustrating a micro-LED chip transfer method according to an embodiment of the present invention.
Figure 6:
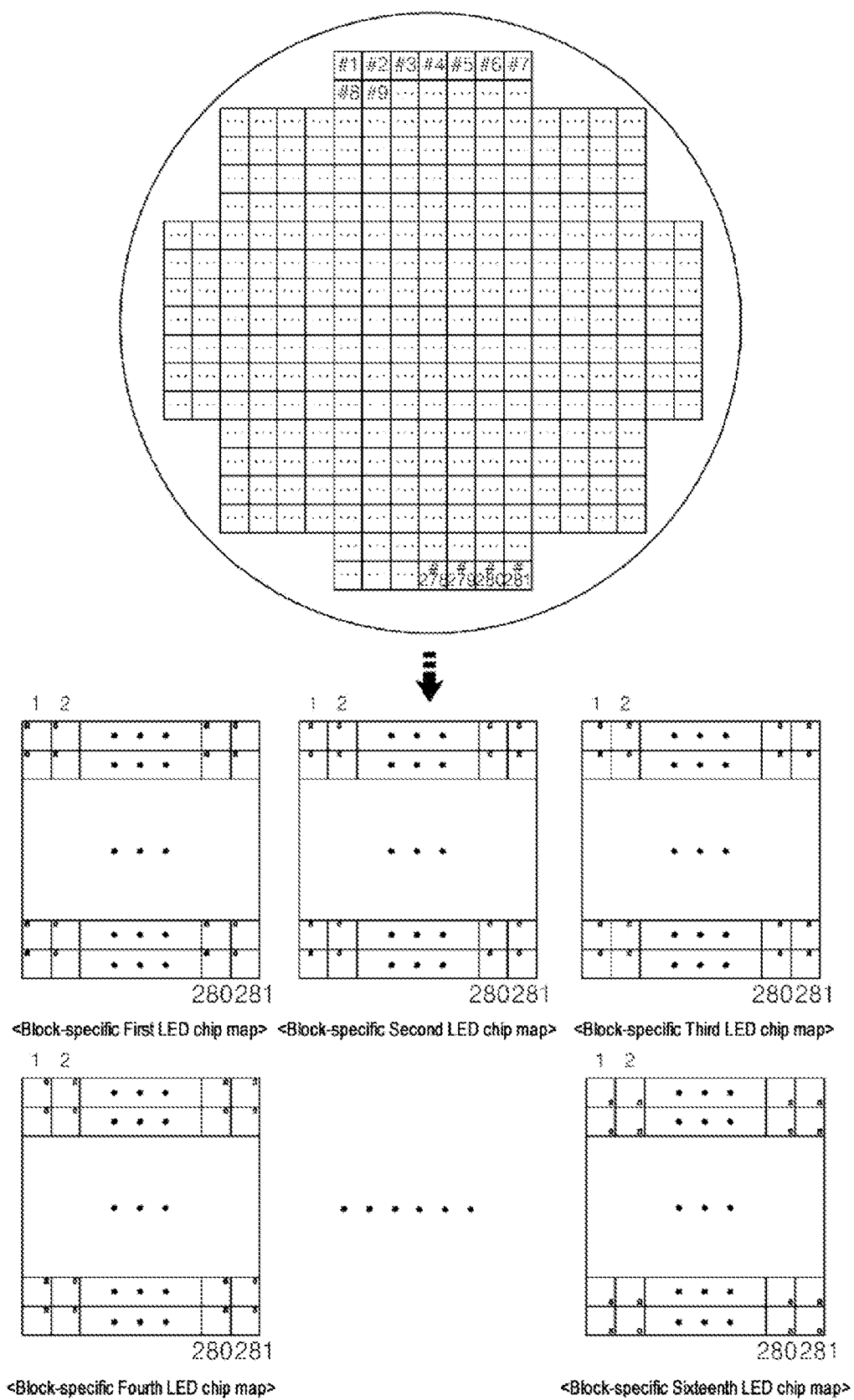
FIG. 6 is a view showing block-specific LED chip maps according to an embodiment of the present invention.
Figure 7:
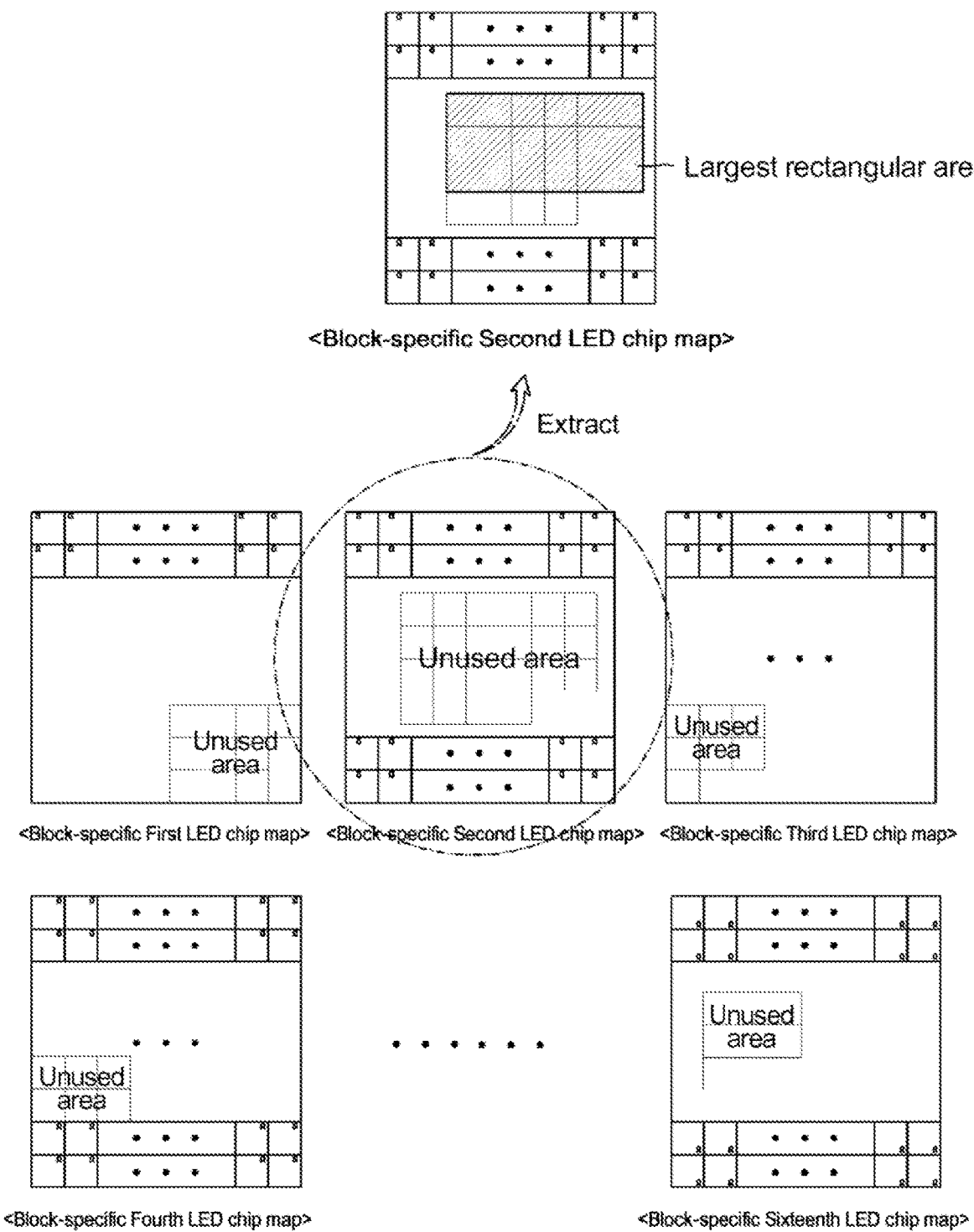
FIG. 7 is a view showing a process of determining the largest rectangular area of unused LED chips in a block-specific LED chip map extracted according to an embodiment of the present invention.
Figure 8:
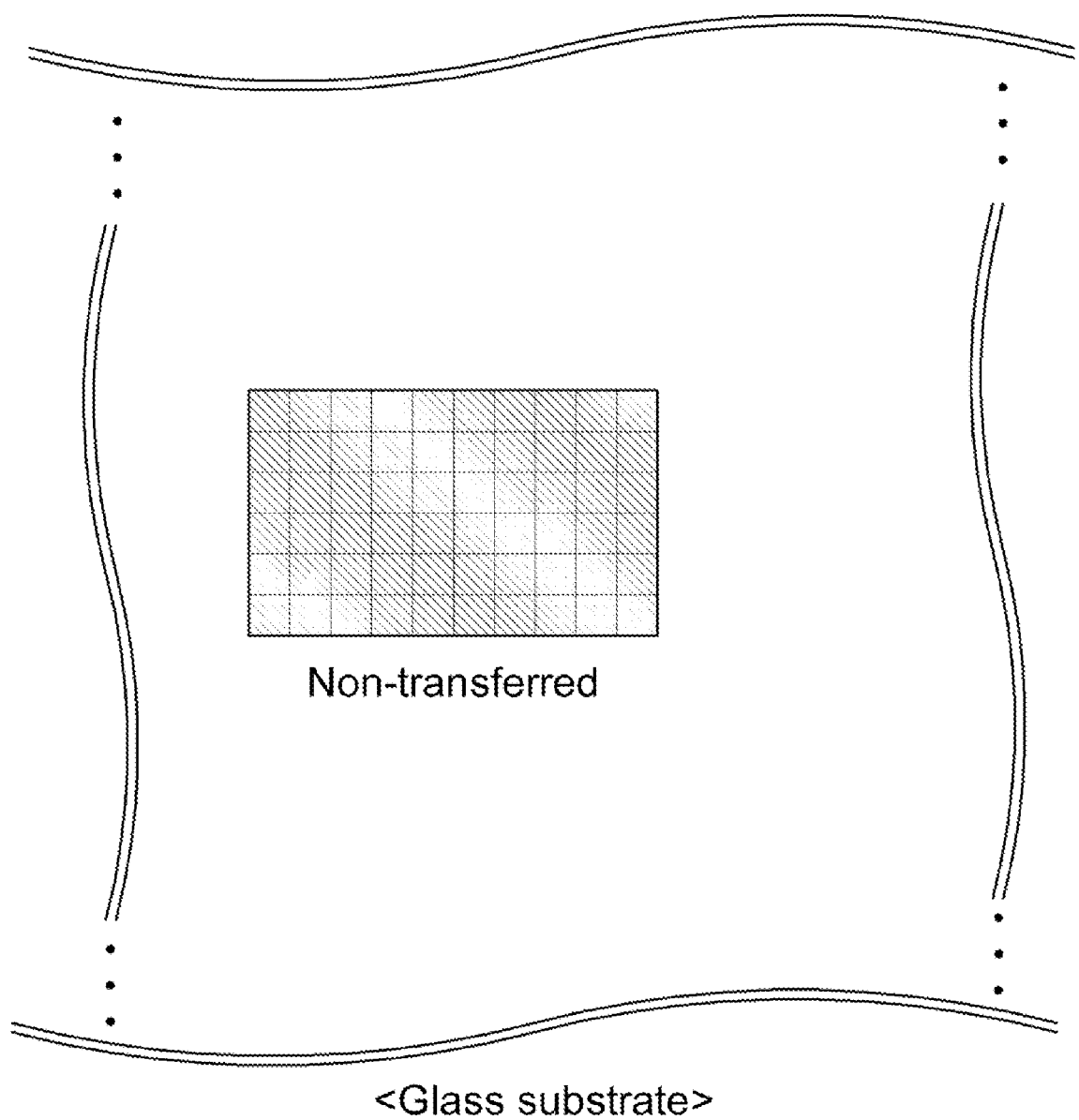
FIG. 8 is a view showing a transferred area and a non-transferred area on a glass substrate according to an embodiment of the present invention.
Figure 9:
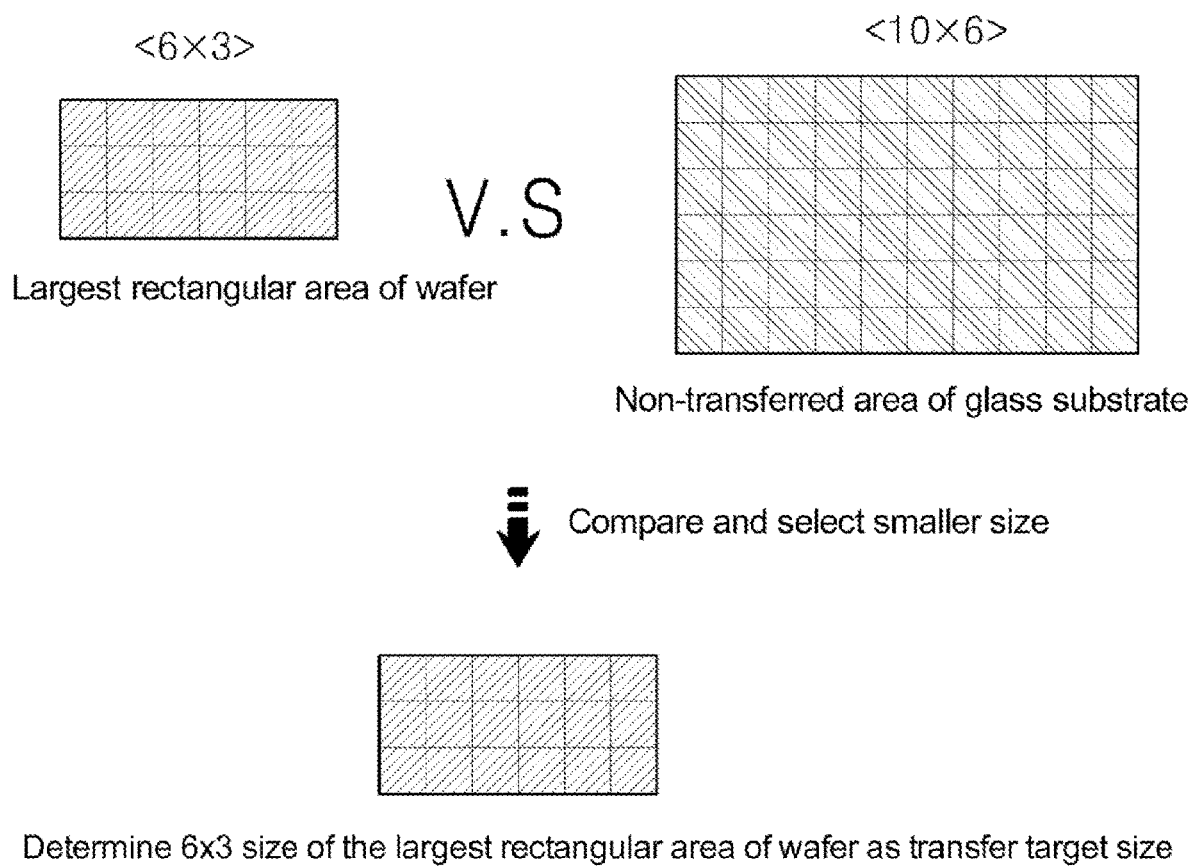
FIG. 9 is a view showing a comparison and determination process according to an embodiment of the present invention.
Figure 10:
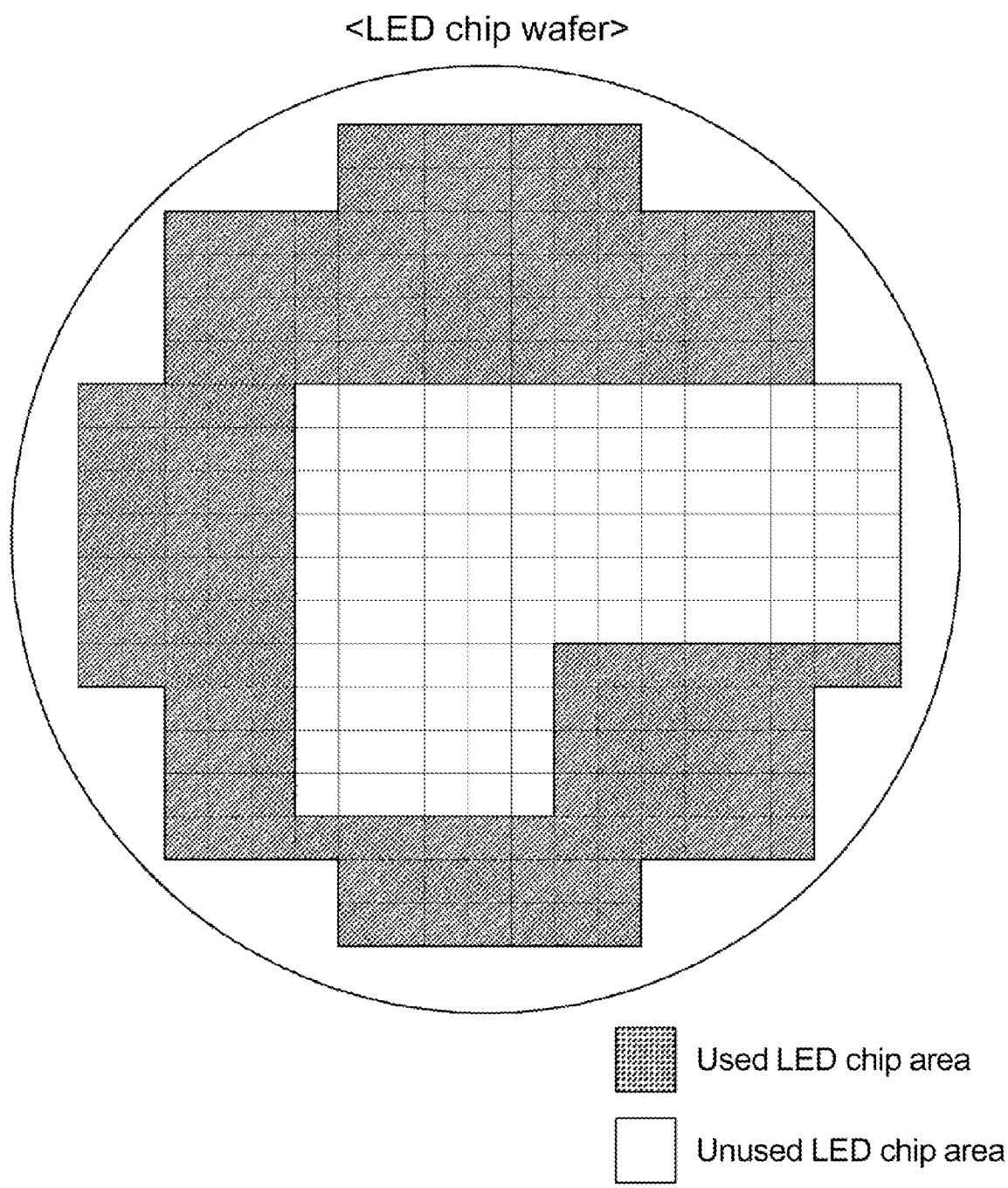
FIG. 10 is a view showing a non-transferred area of a wafer according to an embodiment of the present invention.
Figure 11:
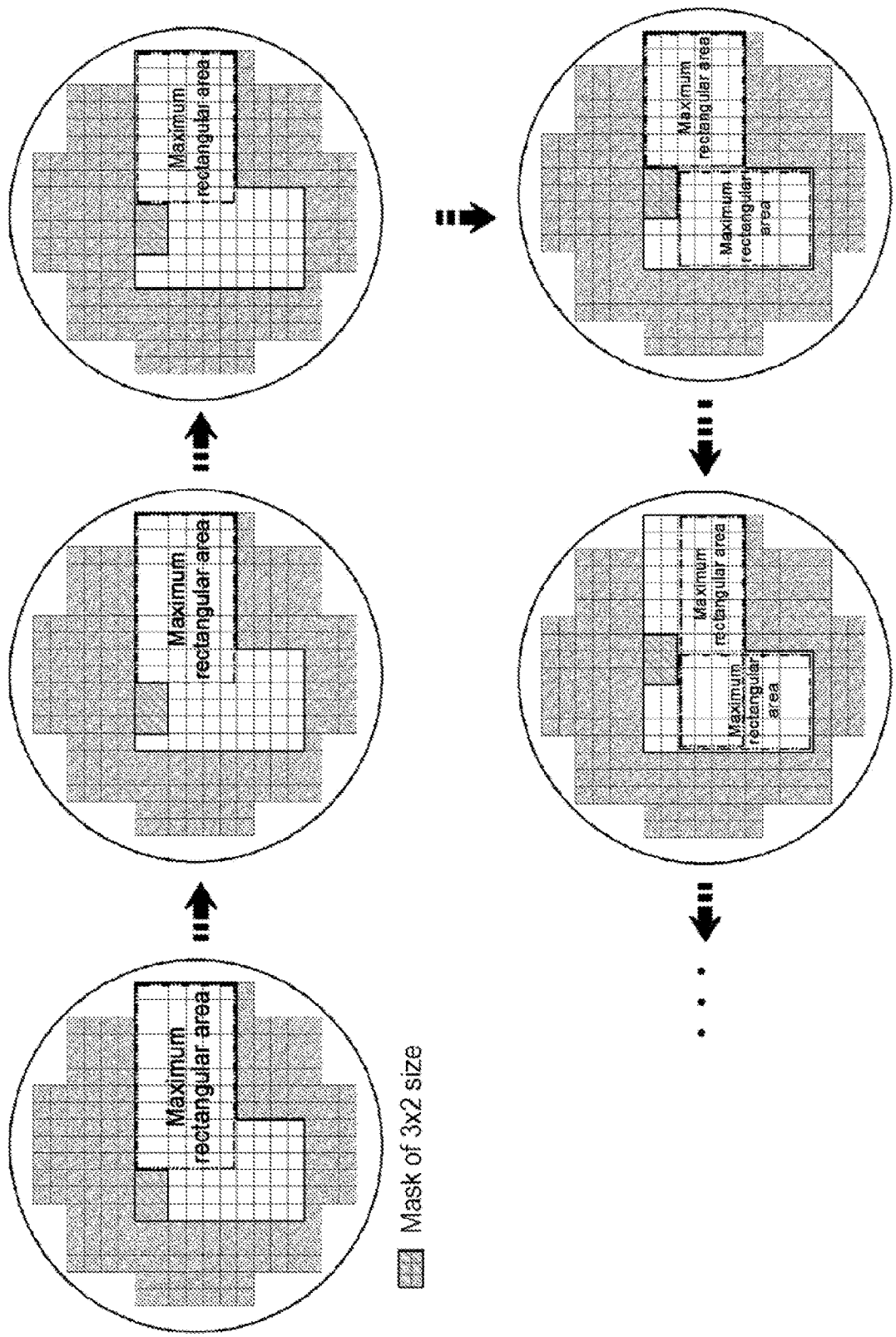
FIG. 11 is a view showing an example of detecting a size of a maximum rectangular area for each block in a non-transferred area of a wafer according to an embodiment of the present invention.
Figure 12:
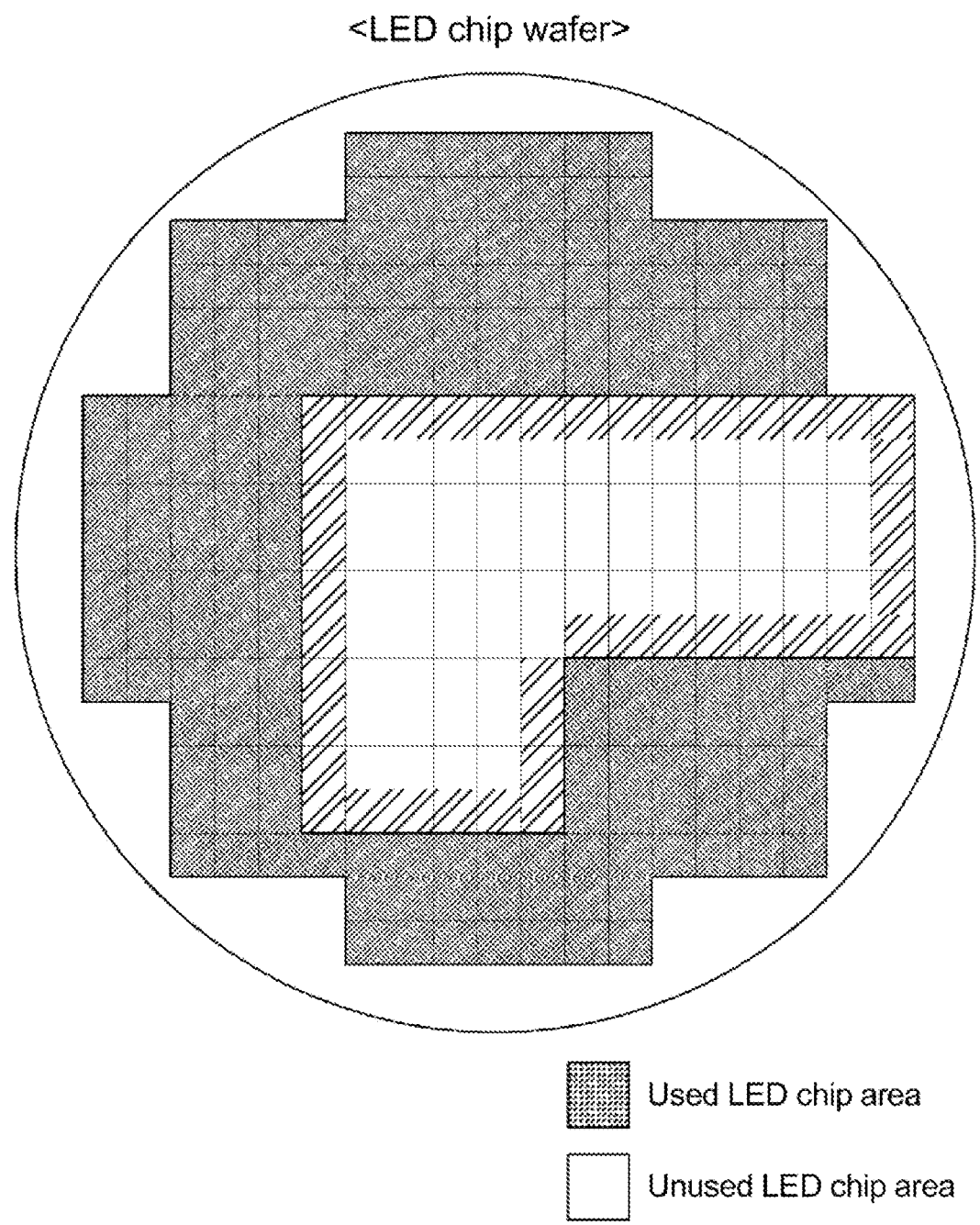
FIG. 12 is a view showing blocks of unused LED chips adjacent to blocks of used LED chips according to an embodiment of the present invention.

FIG. 5 is a flowchart illustrating a micro-LED chip transfer method according to an embodiment of the present invention, FIG. 6 is a view showing block-specific LED chip maps according to an embodiment of the present invention, FIG. 7 is a view showing a process of determining the largest rectangular area of unused LED chips in a block-specific LED chip map extracted according to an embodiment of the present invention, FIG. 8 is a view showing a transferred area and a non-transferred area on a glass substrate according to an embodiment of the present invention, FIG. 9 is a view showing a comparison and determination process according to an embodiment of the present invention, FIG. 10 is a view showing a non-transferred area of a wafer according to an embodiment of the present invention, FIG. 11 is a view showing an example of detecting a size of a maximum rectangular area for each block in a non-transferred area of a wafer according to an embodiment of the present invention, FIG. 12 is a view showing blocks of unused LED chips adjacent to blocks of used LED chips according to an embodiment of the present invention, and FIG. 13 is a view showing an example of blocks of unused LED chips having the maximum rectangular area of the largest size according to an embodiment of the present invention.

A micro-LED chip transfer method according to the present invention based on laser lift-off (LLO) that transfers micro-LED chips formed in each block of a wafer onto a glass substrate may include a transfer target size determination step S510, a mask size determination step S520, a wafer transfer target area position determination step S530, and a transfer step S540.

The transfer target size determination step S510 is a step of determining a size of a transfer target to be transferred, and determines the transfer target size using a block-specific LED chip map that stores information on the state of using the LED chips for each block of the wafer. This is using block-specific LED chip maps to enhance efficiency of using the LED chips on the wafer.

To this end, the transfer target size determination step S510 may include a block-specific LED chip map search step S511, a wafer non-transferred maximum size determination step S512, a glass non-transferred maximum size determination step S513, and a comparison and determination step S514.

The block-specific LED chip map search step S511 is a step of extracting a block-specific LED chip map having the largest number of unused LED chips by searching a block-specific LED chip map that stores information on the state of using the LED chips for each block of the wafer. Here, information on the state of using the LED chips is information that can distinguish transfer-use (U), transfer-not-use (NU), and LED chip Not-Exist (NE). Transfer-use (U) refers to an LED chip that is transferred to a glass substrate by a laser beam, and transfer-not-use (NU) refers to an LED chip that is not transferred, and LED chip Not-Exist (NE) means that an LED chip is not formed in a corresponding area.

The block-specific LED chip map (block map) is a map in which information on the state of using the LED chips is stored for each chip in each block, and as shown in FIG. 6, a block-specific first LED chip map is a map in which information on the state of using a first LED chip of each block is stored, a block-specific second LED chip map is a map in which information on the state of using a second LED chip of each block is stored, and a block-specific third LED chip map is a map in which information on the state of using a third LED chip of each block is stored. When M×N LED chips are formed in a block on the wafer, M×N block-specific LED chip maps will be provided. The block-specific LED chip map stores information on the state of using a corresponding LED chip, and the number and shape of unused LED chips will be different for each block-specific LED chip map.

The process of extracting a block-specific LED chip map having the largest number of unused LED chips by searching a block-specific LED chip map is a step of extracting a block-specific LED chip map having the largest number of unused LED chips by grasping the number of unused LED chips from the block-specific LED chip map. For example, when sixteen LED chips of 4×4 are formed in each block as shown in FIG. 7, and it is assumed that a first LED chip is not used in ten blocks in the case of the block-specific first LED chip map, a second LED chip is not used in eighteen blocks in the case of the block-specific second LED chip map, a third LED chip is not used in seven blocks in the case of the block-specific third LED chip map, a fourth LED chip is not used in six blocks in the case of the block-specific fourth LED chip map, and LED chips are not used in less than eighteen blocks in the case of the block-specific fifth to sixteenth LED chip maps, the block-specific second LED chip map in which LED chips are not used in as many as eighteen blocks will be extracted.

The wafer non-transferred maximum size determination step S512 is a step of determining the largest rectangular area, in which LED chips are not used, from the extracted block-specific LED chip map as a wafer non-transferred maximum size. For example, as shown in FIG. 7, when the block-specific second LED chip map in which LED chips are not used in eighteen blocks is extracted, the size of eighteen slashed blocks corresponds to the largest rectangular area.

The glass non-transferred maximum size determination step S513 is a step of determining the largest rectangular area in the non-transferred area in the target to be transferred on the glass substrate as a glass non-transferred maximum size. For example, as shown in FIG. 8, a non-transferred area of the glass substrate on which LED chips on the wafer are not transferred is slashed. The comparison and determination step S514 is a step of comparing the wafer non-transferred maximum size and the glass non-transferred maximum size, and determining the smaller size as the transfer target size as shown in FIG. 9.

That is, when the size of the non-transferred area of the wafer is determined as 6×3 through step S512, and the size of the non-transferred area of the glass is determined as 10×6 through step S513, the sizes of the two areas are compared through step S514, and the size of the smaller of the two areas, i.e., the size 6×3 of the non-transferred area of the wafer is determined as the transfer target size.

Figure 1:
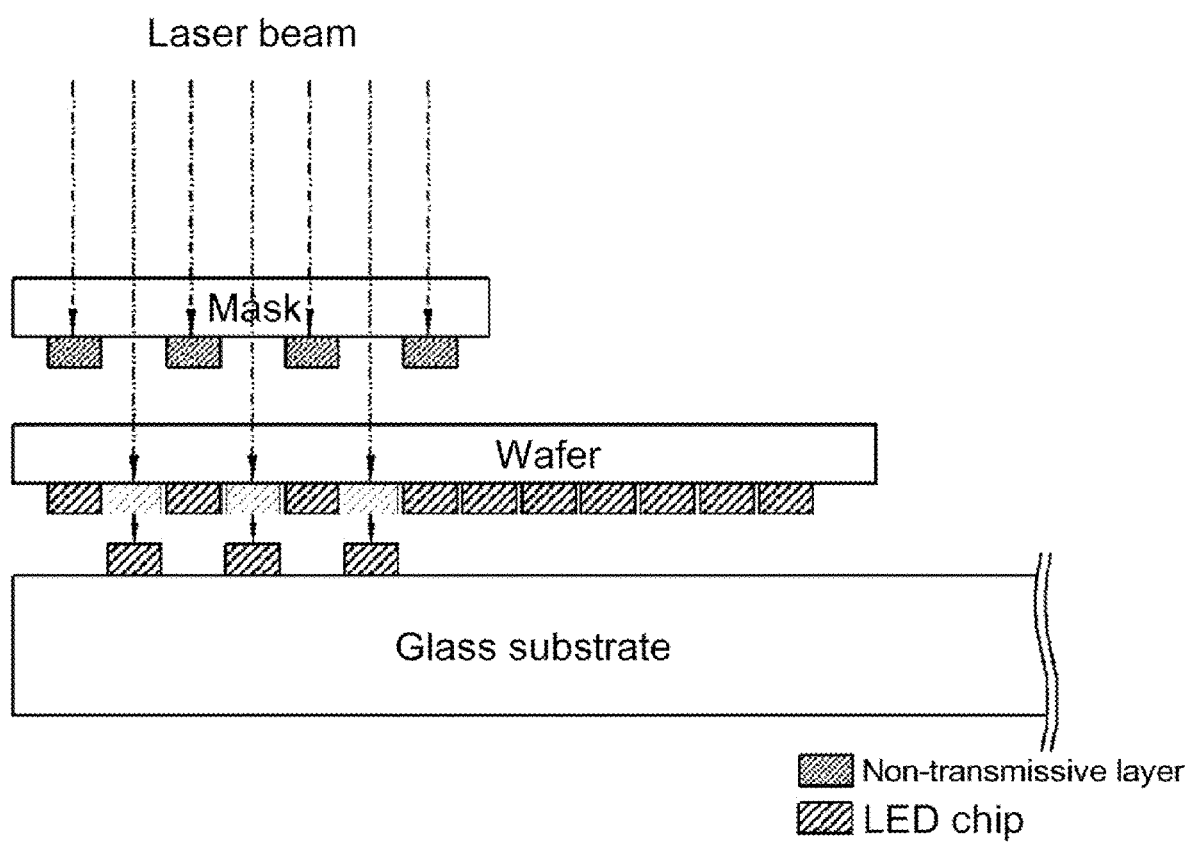
FIG. 1 is a view showing the concept of a transfer process based on laser lift-off (LLO), which shows a view of growing an LED structure on a glass substrate by radiating a laser beam on the top of a wafer.
Figure 2:
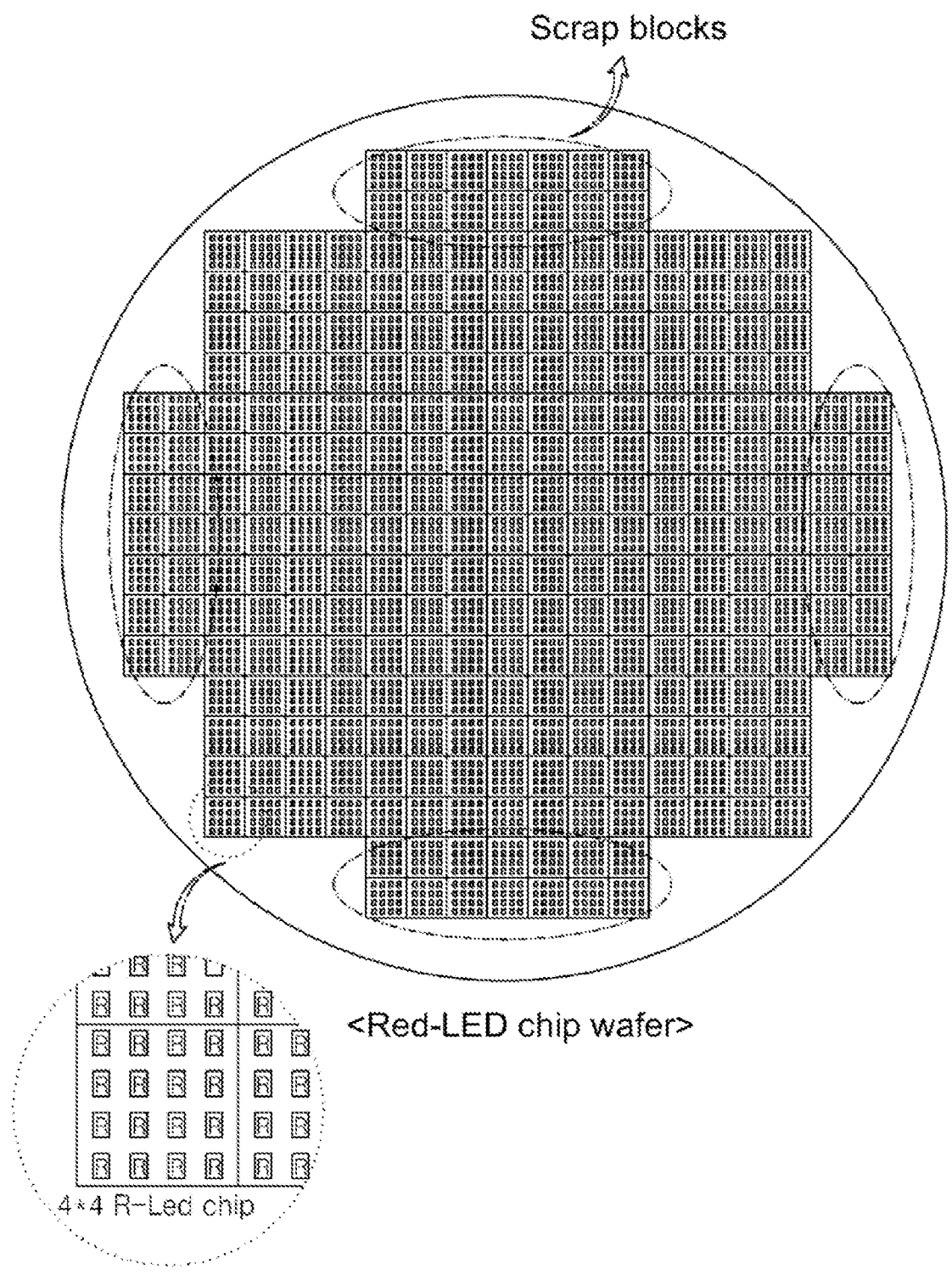
FIG. 2 is a view showing LED chips provided on a wafer.

Meanwhile, after the transfer target size determination step S510, the mask size determination step S520 is performed. The mask size determination step S520 is a step of determining, using the transfer target size, a mask size that can minimize scrap blocks of the wafer not used for transfer when transfer of the LED chips is performed on the wafer targeting non-transferred blocks of the wafer, which are blocks of unused LED chips. When transfer using a wafer is performed, the transfer is performed using a mask of a rectangular unit, so that scrap blocks of the wafer are not transferred as shown in FIG. 2, and this there may be cases in which LED chips in the scrap blocks are not used. Accordingly, a mask size that can minimize the scrap blocks of the wafer, which are not used for transfer, is determined to solve the inefficiency of the scrap blocks.

To this end, the step of determining a mask size may include an integer multiple determination step S521, an integer multiple-based mask size determination step S522, a non-integer multiple-based mask size determination step S523 as shown in FIG. 6.

The integer multiple determination step S521 is a step of determining whether the transfer target size is an integer multiple of the maximum mask size. The integer multiple is determined according to the maximum mask size. For example, in the case where the transfer target size is 6×3 and the maximum mask size is 2×1, the transfer target size corresponds to an integer multiple of 6×3, which is three times larger than the maximum mask size. On the contrary, in the case where the transfer target size is 6×3 and the maximum mask size is 3×1, when the maximum mask size is doubled, the maximum mask size becomes 6×2 to be smaller than the transfer target size and does not become an integer multiple, and when the maximum mask size is tripled, the maximum mask size becomes 9×3 to be larger than the transfer target size and does not become an integer multiple.

The integer multiple-based mask size determination step S522 is a step of determining the maximum mask size as the mask size when the transfer target size is an integer multiple of the maximum mask size. For example, when the transfer target size is 6×3 assuming that the maximum mask size is 2×1, since the transfer target size of 6×3 is three times larger than the maximum mask size of 2×1 and is an integer multiple, the maximum mask size of 2×1 is determined as the mask size.

When the transfer target size is not an integer multiple of the maximum mask size, the non-integer multiple-based mask size determination step S523 calculates the number of maximum size transfers, which is the number of transfers when the wafer transfer target area is transferred with the maximum mask size, and the number of reduced size transfers, which is the number of transfers when transfer is performed with a reduced mask size that can transfer the entire wafer transfer target area, and then determines a mask size in consideration of the calculated number of maximum size transfers and reduced size transfers.

For example, in the case where the transfer target size is 6×3 assuming that the maximum mask size is 3×1, when the maximum mask size is doubled, the maximum mask size becomes 6×2, which does not correspond to the transfer target size of 6×3, and is not an integer multiple, when the maximum mask size is tripled, the maximum mask size becomes 9×3, which is not an integer multiple, a non-integer multiple process should be performed.

The number of maximum size transfers, which is the number of transfers when the wafer transfer target area is transferred with the maximum mask size, is two, which is the number of transfers when a part of the wafer transfer target area is transferred with a maximum mask size of 3×1. That is, since an area of 6×2, which is a part of the transfer target area, can be transferred by transferring twice with a size of 3×1, which is the maximum mask size, the number of maximum size transfers is two.

In addition, the number of reduced size transfers, which is the number of transfers when transfer is performed with a reduced mask size that can transfer the entire wafer transfer target area, is three, which is the number of transfers when the entire wafer transfer target area is transferred with a reduced mask size of 2×1, which is smaller than the maximum mask size of 3×1. That is, since the entire transfer target area of 6×3 can be transferred by transferring three times with a reduced mask size of 2×1, the number of reduced size transfers is three.

The mask size is determined in consideration of the calculated number of maximum size transfers of two and the number of reduced size transfers of three.

Describing in more detail, when the number of times obtained by subtracting the number of maximum size transfers from the number of reduced size transfers is within a preset option value, the reduced mask size is determined as the mask size. For example, when the number of times obtained by subtracting the number of maximum size transfers of two from the number of reduced size transfers of three is one, and the set option value is one, the subtracted number of one is within the set option value of one, and thus the reduced mask size of 2×1, which is the reduced mask size adjusted to be reduced from the maximum mask size of 3×1, is determined as the mask size.

On the contrary, when the number of times obtained by subtracting the number of maximum size transfers from the number of reduced size transfers is out of the option value, the maximum mask size is determined as the mask size. For example, when the number of times obtained by subtracting the number of maximum size transfers from the number of reduced size transfers is calculated as two, and the set option value is one time, the subtracted number of two is out of the set option value of one, and thus the maximum mask size of 3×1 is determined as the mask size.

Since blind movement of a mask for adjusting a mask size takes time when the mask size is determined in consideration of the number of maximum size transfers and the number of reduced size transfers as described above, the transfer is performed with the maximum mask size without blind adjustment, with all the sacrifice of scrap blocks. However, when the difference between the number of transfers in the case of transferring with the maximum mask size and the number of transfers in the case of transferring with the reduced mask size is within the option value (for example, the number of transfers is one or less), transfer can be performed without leaving a scrap block, and thus transfer is performed with a reduced mask size although it takes time for the operation of adjusting the size of the blind mask.

Meanwhile, after the mask size determination step S520 is performed as described above, the transfer target area position determination step is performed.

The transfer target area position determination step is a step of determining a starting point position of the wafer transfer target area to be transferred. Transfer should be performed by positioning a mask of the determined mask size in the non-transferred area of the wafer as shown in FIG. 10, and it is a step of determining a position of the mask in the non-transferred area of the wafer to perform the transfer.

In determining a starting point position of the wafer transfer target area, the mask size calculated at the mask size determination step S520 is used.

To this end, the wafer transfer target area position determination step S530 includes a maximum rectangular area size detection step S531 and a starting point position determination step S532.

The maximum rectangular area size detection step S531 is a step of detecting, when the starting point position of a mask having the mask size is positioned at a block of unused LED chips, a size of a maximum rectangular area, which is obtained by adding remaining other blocks of unused LED chips, for each block of unused LED chips. When it is assumed that the mask size is determined as a size of 3×2, it is a step of finding a size of a maximum rectangular area in the remaining non-transferred area, when a mask having a mask size of 3×2 is positioned at each block in the non-transferred area of the wafer, one after another as shown in FIG. 11.

However, the maximum rectangular area size detection step does not need to be performed for all the blocks in the non-transferred area of the wafer, and detects the size of the maximum rectangular area only for the edge blocks in the non-transferred area of the wafer. That is, the size of the maximum rectangular area is detected only for the blocks of unused LED chips adjacent to the blocks of used LED chips, like the slashed area shown in FIG. 12. That is, since a maximum rectangular area of the largest size is detected from the blocks of unused LED chips adjacent to the blocks of used LED chips although the maximum rectangular area size is detected for each block in the unused area of the wafer, the maximum rectangular area is not detected for the remaining blocks that are not adjacent to the blocks of used LED chips for the sake of efficiency.

The starting point position determination step S532 is a step of comparing the detected size of the maximum rectangular area for each block of unused LED chips, and determining a block of unused LED chips having the maximum rectangular area of the largest size as the starting point position of the mask.

For example, when a block of unused LED chips has a maximum rectangular area of the largest size when the mask is positioned at the first block in the non-transferred area of the wafer, the first block becomes the starting point position of the mask. When a block of unused LED chips has a maximum rectangular area of the largest size when the mask is positioned at the second block in the non-transferred area of the wafer, the second block becomes the starting point position of the mask.

When a plurality of blocks of unused LED chips having a maximum rectangular area of the largest size is detected at the starting point position determination step S532, any one block in the non-transferred area may be arbitrarily determined as the starting point position of the mask.

However, when a block is arbitrarily selected among the blocks in the non-transferred area having the maximum rectangular area and used as the starting point position of the mask as described above, it has inefficiency of increasing the probability of generating scrap blocks among the non-transferred blocks of the wafer.

In order to minimize the scrap blocks like this, when a plurality of blocks of unused LED chips having a maximum rectangular area of the largest size is detected at the starting point position determination step S532, a block of unused LED chips having the largest number of adjacent blocks of used LED chips, among the blocks of unused LED chips detected as having the maximum rectangular area of the largest size, is determined as the starting point position of the mask. For example, when block A of FIG. 13(a), block B of FIG. 13(b), and block C of FIG. 13(c) are detected among the blocks of unused LED chips having the maximum rectangular area of the largest size, block A of FIG. 13(a) having the largest number of adjacent blocks of used LED chips is determined as the starting point position of the mask.

Meanwhile, after the wafer transfer target area position determination step S530, the transfer step S540 is performed. The transfer step S540 is a step of transferring LED chips formed in the wafer transfer target area by positioning a mask having the mask size at the starting point position of the wafer transfer target area and radiating a laser beam thereon. That is, transfer is performed after a mask having the determined mask size is positioned at the determined position of the wafer transfer target area.

The embodiments in the description of the present invention described above are presented by selecting the most preferred examples from various possible examples to help understanding of those skilled in the art, and the technical spirit of this present invention is not necessarily limited or restricted only by these embodiments, and various changes and modifications and equivalent other embodiments are possible without departing from the technical spirit of the present invention.

DESCRIPTION OF SYMBOLS

S510: Transfer target size determination step
S520: Mask size determination step
S530: Wafer transfer target area position determination step
S540: Transfer step

The invention claimed is:

1. A micro-LED chip transfer method based on laser lift-off (LLO) for transferring micro-LED chips formed in each block of a wafer onto a glass substrate, the method comprising:
a transfer target size determination step of determining a size of a transfer target to be transferred using a block-specific LED chip map that stores information on a state of using the LED chips for each block of the wafer;

a mask size determination step of determining, using the transfer target size, a mask size that can minimize scrap blocks of the wafer not used for transfer when transfer of the LED chips is performed on the wafer targeting non-transferred blocks of the wafer, which are blocks of unused LED chips;

a wafer transfer target area position determination step of determining a starting point position of a wafer transfer target area to be transferred; and a transfer step of transferring LED chips formed in the wafer transfer target area by positioning a mask having the mask size at the starting point position of the wafer transfer target area and radiating a laser beam thereon, wherein the transfer target size determination step includes:

a block-specific LED chip map search step of extracting a block-specific LED chip map having the largest number of unused LED chips by searching a block-specific LED chip map that stores information on the state of using the LED chips for each block of the wafer;

a wafer non-transferred maximum size determination step of determining a largest rectangular area, in which LED chips are not used, from the extracted block-specific LED chip map as a wafer non-transferred maximum size;

a glass non-transferred maximum size determination step of determining a largest rectangular area in a non-transferred area on the glass substrate as a glass non-transferred maximum size; and a comparison and determination step of comparing the wafer non-transferred maximum size and the glass non-transferred maximum size, and determining a smaller size as the transfer target size.

2. The method according to claim 1, wherein the information on the state of using the LED chips is information that can distinguish transfer-use (U), transfer-not-use (NU), and LED chip Not-Exist (NE).

3. The method according to claim 1, wherein the wafer transfer target area position determination step determines the starting point position of the wafer transfer target area using the mask size.

4. The method according to claim 3, wherein the wafer transfer target area position determination step includes:

a maximum rectangular area size detection step of detecting, when the starting point position of a mask having the mask size is positioned at a block of unused LED chips, a size of a maximum rectangular area, which is obtained by adding remaining other blocks of unused LED chips, for each block of unused LED chips; and a starting point position determination step of comparing the detected size of a maximum rectangular area for each block of unused LED chips, and determining a block of unused LED chips having the maximum rectangular area of the largest size as the starting point position of the mask.

5. The method according to claim 4, wherein the maximum rectangular area size detection step detects a size of a maximum rectangular area only for edge blocks in the non-transferred area of the wafer.

* * * * *